(12) United States Patent
Rocher et al.

(10) Patent No.: US 12,024,035 B2
(45) Date of Patent: Jul. 2, 2024

(54) METHOD AND DEVICE FOR CONTROLLING A CONNECTION BETWEEN A BATTERY AND A SOCKET OF AN ELECTRIC MOTOR VEHICLE

(71) Applicant: VITESCO TECHNOLOGIES GMBH, Regensburg (DE)

(72) Inventors: Jacques Rocher, Toulouse (FR); Frédéric Stuyk, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 240 days.

(21) Appl. No.: 17/777,139

(22) PCT Filed: Nov. 16, 2020

(86) PCT No.: PCT/EP2020/082289
§ 371 (c)(1),
(2) Date: May 16, 2022

(87) PCT Pub. No.: WO2021/099272
PCT Pub. Date: May 27, 2021

(65) Prior Publication Data
US 2022/0396161 A1    Dec. 15, 2022

(30) Foreign Application Priority Data
Nov. 18, 2019    (FR) ...................................... 1912844

(51) Int. Cl.
*B60L 3/00*    (2019.01)
*B60L 53/16*   (2019.01)
(Continued)

(52) U.S. Cl.
CPC ............ *B60L 53/16* (2019.02); *B60L 3/0092* (2013.01); *G01R 19/0084* (2013.01); *H02J 7/0063* (2013.01); *B60L 50/60* (2019.02)

(58) Field of Classification Search
CPC ........ B60L 3/0092; B60L 53/14; B60L 53/16; B60L 50/60; B60L 3/00; G01R 19/0084;
(Continued)

(56) References Cited

U.S. PATENT DOCUMENTS 8,575,940 B2    11/2013    Yugou et al.
8,669,739 B2    3/2014    Ohtomo
(Continued)

FOREIGN PATENT DOCUMENTS

CN    102868188 A    1/2013
CN    104428682 A    3/2015
(Continued)

OTHER PUBLICATIONS

International Search Report for PCT/EP2020/082289, mailed Feb. 4, 2021, 3 pages.
(Continued)

*Primary Examiner* — Daniel Kessie
*Assistant Examiner* — Xuan Ly
(74) *Attorney, Agent, or Firm* — NIXON & VANDERHYE

(57) ABSTRACT

Disclosed is a device for controlling a connection between an electrical socket and a battery. The device for controlling a connection includes a first contactor arranged between a first terminal of the battery and a first terminal of the electrical socket, a second contactor arranged between a second terminal of the battery and a second terminal of the electrical socket, a first computer and a second computer. The first computer includes a high-side switch, arranged between a power supply line and the first contactor, and a low-side switch arranged between the second contactor and a ground line, and the second computer includes a low-side switch arranged between the first contactor and the ground
(Continued)

line, and a high-side switch arranged between the power supply line and the second contactor.

20 Claims, 3 Drawing Sheets

(51) Int. Cl.
*G01R 19/00* (2006.01)
*H02J 7/00* (2006.01)
*B60L 50/60* (2019.01)

(58) Field of Classification Search
CPC ...... G01R 19/00; H02J 7/0063; H02J 7/0042; H02J 7/02; H02J 7/00; Y02T 10/70; Y02T 10/7072; Y02T 90/14
USPC ........................................................ 307/10.1
See application file for complete search history.

(56) References Cited

U.S. PATENT DOCUMENTS

| | | | |
|---|---|---|---|
| 9,030,207 B2 | 5/2015 | Lasson et al. | |
| 9,283,852 B2 | 3/2016 | Jefferies et al. | |
| 9,470,737 B2 | 10/2016 | Lasson et al. | |
| 9,533,588 B2 | 1/2017 | Sadano et al. | |
| 10,168,373 B2 | 1/2019 | Zaki et al. | |
| 2011/0148428 A1 | 6/2011 | Lasson et al. | |
| 2011/0210746 A1 | 9/2011 | Yugou et al. | |
| 2013/0009598 A1 | 1/2013 | Ohtomo | |
| 2013/0300429 A1 | 11/2013 | Jefferies et al. | |
| 2014/0103936 A1 | 4/2014 | Lasson et al. | |
| 2015/0137755 A1 | 5/2015 | Sadano et al. | |
| 2015/0160281 A1 | 6/2015 | Zaki et al. | |
| 2017/0101029 A1* | 4/2017 | Kawano ................ B60L 3/0038 |
| 2017/0355350 A1 | 12/2017 | Namou et al. | |
| 2018/0208079 A1 | 7/2018 | Noppakunkajorn et al. | |
| 2018/0236888 A1 | 8/2018 | Yabuuchi et al. | |

FOREIGN PATENT DOCUMENTS

| | | |
|---|---|---|
| CN | 108357360 A | 8/2018 |
| DE | 10 2011 004 516 A1 | 8/2012 |
| EP | 2 361 799 A2 | 8/2011 |
| EP | 3 154 150 | 4/2017 |
| JP | 2010-178454 A | 8/2010 |
| JP | 5240462 B2 | 7/2013 |
| WO | 2010/036153 A1 | 4/2010 |

OTHER PUBLICATIONS

Written Opinion of the ISA for PCT/EP2020/082289, mailed Feb. 4, 2021, 6 pages.
Balakrishnan et al., "Current Controlled Driver for 24-V DC Solenoid With Plunger Fault Detection", https://www.ti.com/lit/ug/tidu578/tidu578.pdf?ts=I, XP055713501, Nov. 2018, pp. 1-48 (submission pending).
Notification to Grant Patent Right for Invention issued in Chinese Patent Application No. 202080079696.5 dated May 18, 2023.
Balakrishnan et al., "Current Controlled Driver for 24-V DC Solenoid With Plunger Fault Detection," Texas Instruments, https://www.ti.com/lit/ug/tidu578/tidu578.pdf?ts=I , XP055713501, Nov. 2014, pp. 1-48.

* cited by examiner

[Fig. 1]
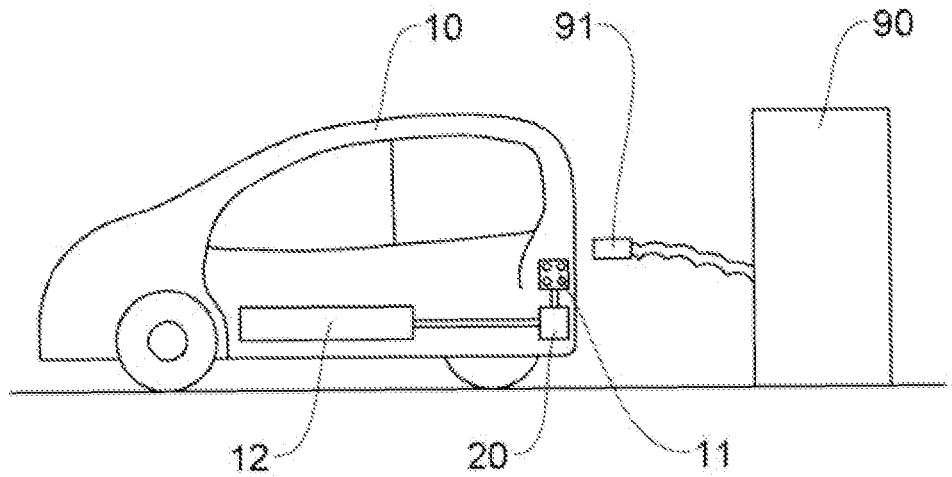
[Fig. 2]
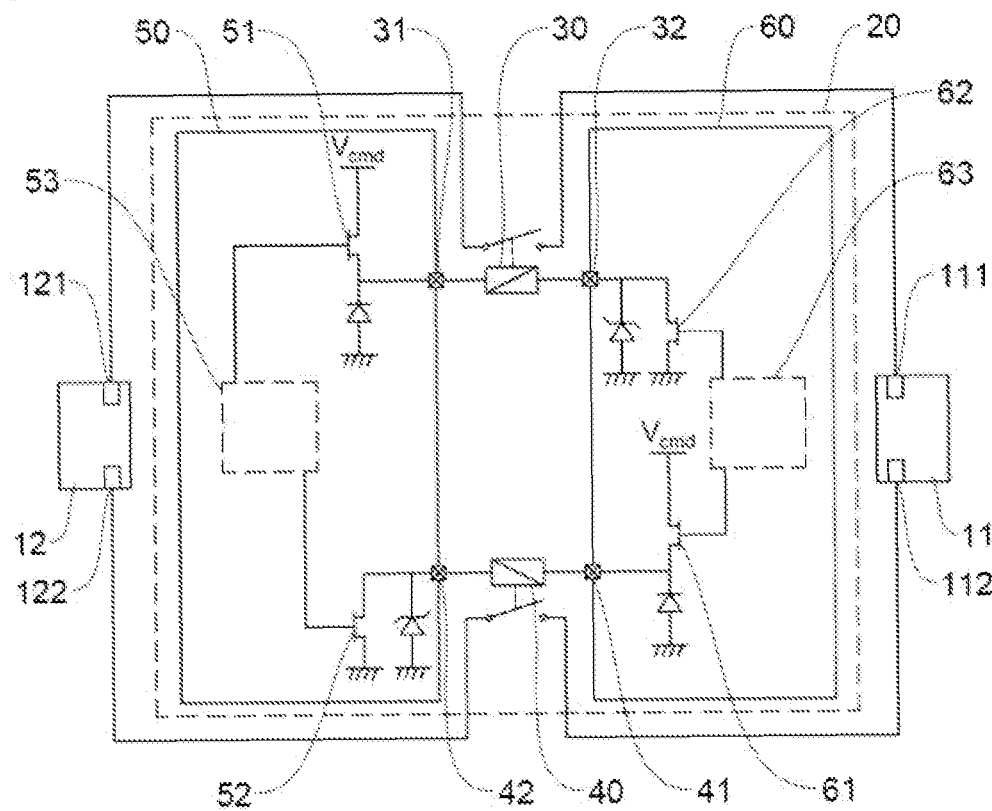

[Fig. 3]
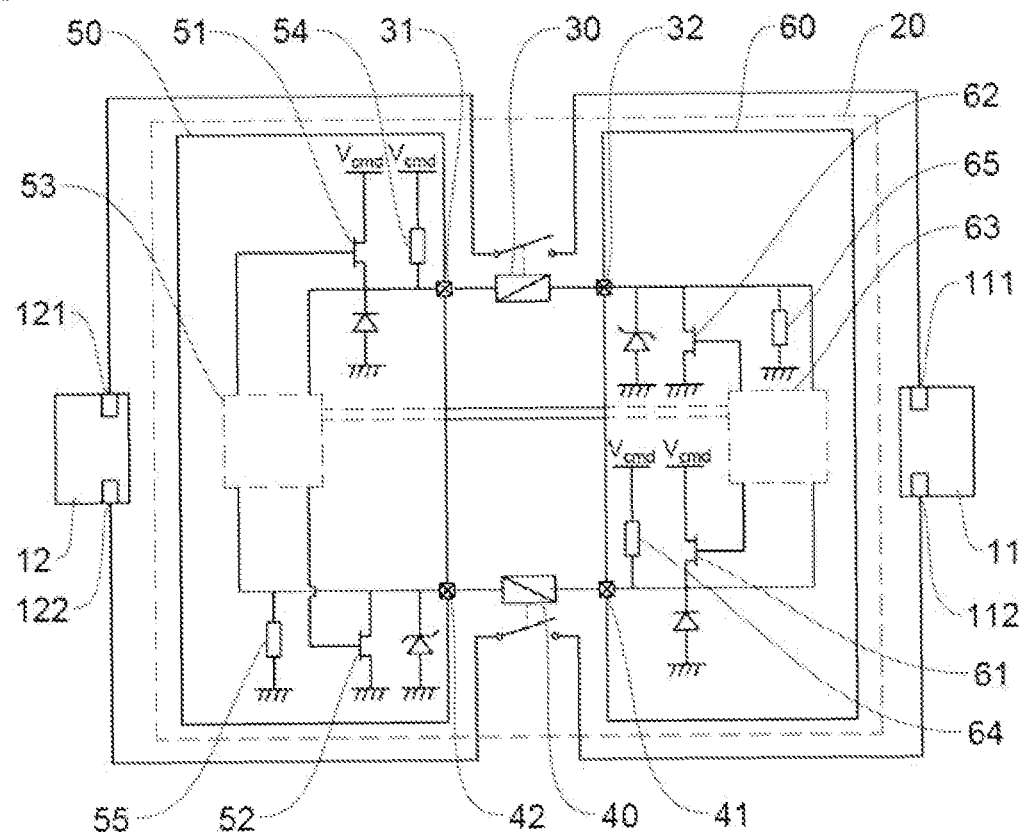
[Fig. 4]
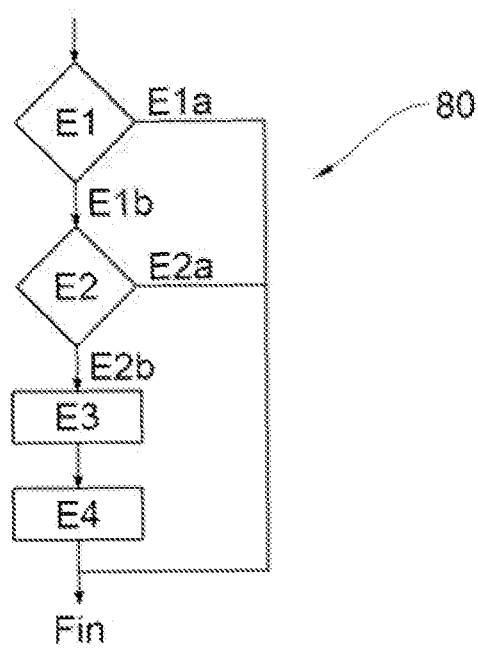

[Fig. 5]
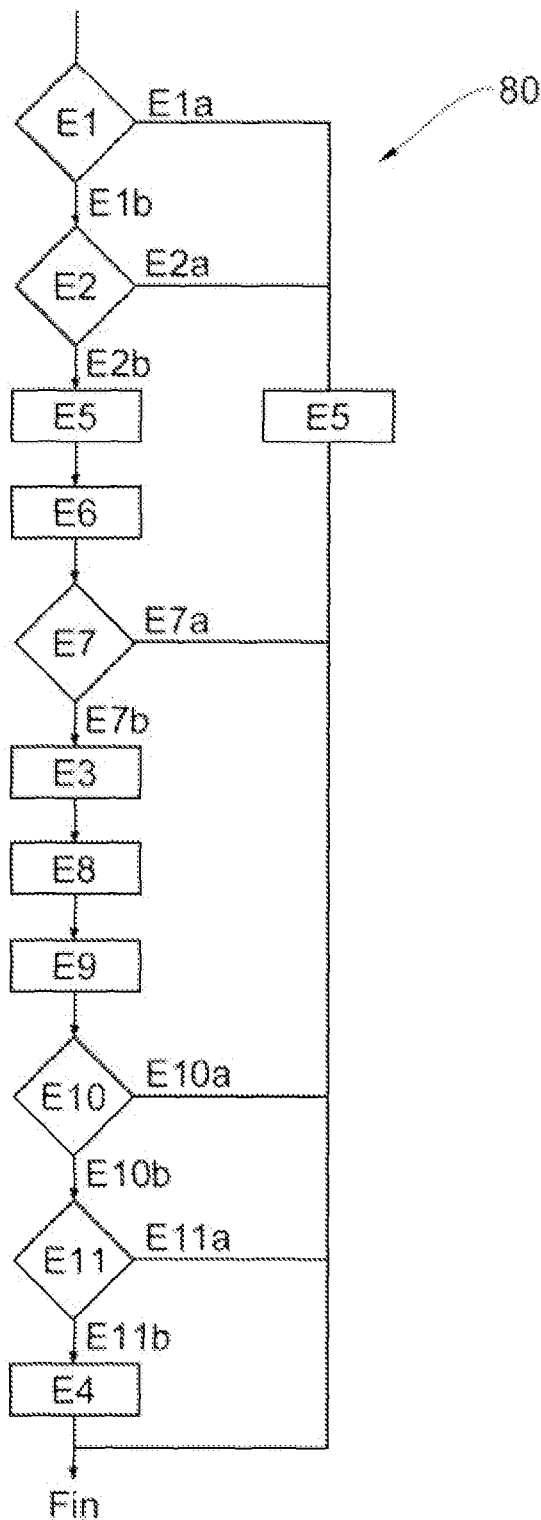

METHOD AND DEVICE FOR CONTROLLING A CONNECTION BETWEEN A BATTERY AND A SOCKET OF AN ELECTRIC MOTOR VEHICLE

CROSS-REFERENCE RELATED TO PRIORITY APPLICATIONS

This application is the U.S. national phase of International Application No. PCT/EP2020/082289 filed Nov. 16, 2020, which designated the U.S. and claims priority to FR Patent Application No. 1912844 filed Nov. 18, 2019, the entire contents of each of which are hereby incorporated by reference.

BACKGROUND OF THE INVENTION

Field of the Invention

The present invention belongs to the field of vehicles with an electric motor, and more particularly relates to a device and a method for controlling a connection between an electrical socket of a vehicle with an electric motor, on the one hand, and a battery of said vehicle, on the other hand, said battery being intended to supply power to the electric motor.

Description of the Related Art

In a motor vehicle with an electric motor comprising a rechargeable battery for supplying power to the electric motor, it is necessary to regularly recharge said battery by connecting it to a charging station. To this end, the motor vehicle is equipped with an electrical socket intended to interact with an electrical connector of said charging station.

For safety purposes, the battery is not connected directly to the electrical socket of the motor vehicle, but via a device for controlling a connection, which is suitable for connecting/disconnecting the battery and the electrical socket to/from each other. Specifically, such a battery typically delivers a voltage of the order of several hundred volts, and it is understood that it would be too dangerous for the user of the motor vehicle if such a voltage were permanently present at the electrical socket.

The device for controlling a connection aims specifically to ensure that the battery is connected to said electrical socket only when the electrical connector is connected thereto. When the electrical connector is not connected to the electrical socket, then the device for controlling a connection must ensure that the battery is disconnected from the electrical socket, in order not to risk the user being electrocuted on said electrical socket.

Because it aims to address a personal safety problem, such a device for controlling a connection must be particularly robust and reliable. In particular, such a device for controlling a connection must preferably comply with the constraints established by the ISO 26262 standard, which is an ISO (International Organization for Standardization) standard for safety systems in road vehicles with an engine. The ISO 26262 standard defines several safety levels, denoted by ASIL (automotive safety integrity level), the highest safety level of which, referred to as ASIL D, must preferably be complied with by such devices for controlling a connection. Such constraints make manufacturing such devices for controlling a connection both complicated and costly.

SUMMARY OF THE INVENTION

The objective of the present invention is to overcome all or some of the limitations of the solutions of the prior art, particularly those discussed above, by proposing a solution which makes it possible to reduce the complexity and the cost of manufacturing devices for controlling a connection, without reducing the reliability and the robustness of said devices for controlling a connection.

To this end, and according to a first aspect, the invention relates to a device for controlling a connection, in a vehicle with an electric motor, between an electrical socket of said vehicle and a battery of said vehicle, said electrical socket being intended to interact with an electrical connector so as to charge said battery, and said battery being intended to supply power to the electric motor of said vehicle. The device for controlling a connection comprises a first contactor arranged between a first terminal of the battery and a first terminal of the electrical socket, a second contactor arranged between a second terminal of the battery and a second terminal of the electrical socket, a first computer and a second computer. The first contactor comprises a first control terminal and a second control terminal, and the second contactor comprises a first control terminal and a second control terminal.

The first computer comprises a high-side switch, arranged between a power supply line and the first control terminal of the first contactor, and a low-side switch arranged between the second control terminal of the second contactor and a ground line.

The second computer comprises a low-side switch arranged between the second control terminal of the first contactor and the ground line, and a high-side switch arranged between the power supply line and the first control terminal of the second contactor.

Thus, the first terminal and the second terminal of the battery are connected by means of a first contactor and a second contactor, respectively, to a first terminal and a second terminal of the electrical socket, respectively. As is known, a contactor is an electrotechnical device making it possible to establish or to interrupt the flow of electric current. Thus, the first contactor can be controlled so as to connect or disconnect the first terminal of the battery and the first terminal of the electrical socket to or from each other. Likewise, the second contactor can be controlled so as to connect or disconnect the second terminal of the battery and the second terminal of the electrical socket to or from each other.

According to the invention, each contactor is furthermore controlled by two distinct computers, namely the first computer and the second computer. Thus, the battery can be connected to the electrical socket only when this connection is authorized both by the first computer and by the second computer. Such provisions are advantageous in that they make it possible to reduce the complexity of each computer with respect to using a single computer. Specifically, in the case where the ASIL D safety level had to be checked by the device for controlling a connection, and in the case of a single computer, then said single computer would have to check the ASIL D safety level. With two computers, the introduced redundancy makes it possible to have a device for controlling a connection checking the ASIL D safety level with two computers each checking a lower safety level, typically an ASIL B safety level. It is simpler and cheaper to manufacture two computers checking the ASIL B safety level than to manufacture one computer checking the ASIL D safety level.

Furthermore, the first computer and the second computer are symmetrical in that each of these computers connects a control terminal of one of the contactors to the power supply line and a control terminal of the other contactor to the ground line, each contactor comprising a first control terminal which must be connected to the power supply line and a second control terminal which must be connected to the ground line. As a result of this symmetry, the first computer and the second computer, though distinct, can comprise many hardware components and/or many software components which are identical, this making it possible to further reduce the complexity and the cost of manufacturing the device for controlling a connection.

In particular embodiments, the device for controlling a connection can further comprise one or more of the following features, taken alone or in any technically possible combination.

In particular embodiments, the first computer and the second computer are identical, that is to say that they are composed of the same hardware components and of the same software components.

Such provisions make it possible to further reduce the complexity and the cost of manufacturing the device for controlling a connection, particularly by making economies of scale, but also makes it possible to simplify the validation and the maintenance of the device for controlling a connection.

In particular embodiments, the first control terminal of the first contactor and the first control terminal of the second contactor are connected to the power supply line by means of respective high-side resistive components, and the second control terminal of the first contactor and the second control terminal of the second contactor are connected to the ground line by means of respective low-side resistive components.

In particular embodiments, the first computer comprises a processing circuit configured:
to measure a voltage at the first control terminal of the first contactor and to measure a voltage at the second control terminal of the second contactor, and
to diagnose the first contactor and the second contactor according to the voltage measurements.

In particular embodiments, the second computer comprises a processing circuit configured:
to measure a voltage at the second control terminal of the first contactor and to measure a voltage at the first control terminal of the second contactor, and
to diagnose the first contactor and the second contactor according to the voltage measurements.

In particular embodiments, the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

Such provisions make it possible to bolster the reliability of the device for controlling a connection, insofar as each computer can take into account diagnostic information and/or synchronization information originating from the other computer so as to determine whether or not it must authorize the connection between the battery and the electrical socket of the vehicle.

According to a second aspect, the invention relates to a vehicle comprising an electric motor, a battery intended to supply power to said electric motor and an electrical socket intended to interact with an electrical connector so as to charge said battery. The vehicle further comprises a device for controlling a connection according to any one of the embodiments of the invention.

According to a third aspect, the invention relates to a method for controlling a connection implemented by a device for controlling a connection according to any one of the embodiments of the invention. The method for controlling a connection comprises, when each high-side switch and each low-side switch is in the open state, steps of:
the first contactor being diagnosed by the first computer, the high-side switch of the first computer being controlled so as to enter the closed state by the first computer only if no problem is detected at the first contactor by said first computer, and
the second contactor being diagnosed by the first computer, the low-side switch of the first computer being controlled so as to enter the closed state by the first computer only if no problem is detected at the second contactor by said first computer.

In particular implementations, the method for controlling a connection can further comprise one or more of the following features, taken alone or in any technically possible combination.

In particular implementations:
the high-side switch of the first computer is controlled so as to enter the closed state by the first computer only if no problem is detected at the first contactor and/or at the second contactor by the second computer, and
the low-side switch of the first computer is controlled so as to enter the closed state by the first computer only if no problem is detected at the first contactor and/or at the second contactor by the second computer.

In particular implementations, the method for controlling a connection comprises, after the first computer has controlled the low-side switch so as to enter the closed state and before controlling the high-side switch so as to enter the closed state, a step of the first contactor being diagnosed by said first computer, the high-side switch of the first computer being controlled so as to enter the closed state by the first computer only if no problem is detected at the first contactor by said first computer.

In particular implementations, the high-side switch of the first computer is controlled so as to enter the closed state by the first computer only if said first computer has received, from the second computer, synchronization information indicating that the low-side switch of said second computer has been controlled so as to enter the closed state.

In particular implementations, the method for controlling a connection comprises, after the first computer has controlled the high-side switch so as to enter the closed state and before controlling the low-side switch so as to enter the closed state, a step of the first contactor being diagnosed by said first computer, the low-side switch of the first computer being controlled so as to enter the closed state by the first computer only if no problem is detected at the first contactor by said first computer.

In particular implementations, the low-side switch of the first computer is controlled so as to enter the closed state by the first computer only if said first computer has received, from the second computer, synchronization information indicating that the high-side switch of said second computer has been controlled so as to enter the closed state.

BRIEF DESCRIPTION OF THE DRAWINGS

Other features and advantages of the invention will become more apparent on reading the description which follows. This description is purely illustrative and must be read with reference to the attached drawings, in which:

FIG. 1 is a schematic depiction of a vehicle with an electric motor and of a charging station for charging a battery of the vehicle.

FIG. 2 is a schematic depiction of an exemplary embodiment of a device for controlling a connection.

FIG. 3 is a schematic depiction of a preferred embodiment of a device for controlling a connection.

FIG. 4 is a diagram illustrating the main steps of a method for controlling a connection.

FIG. 5 is a diagram illustrating a preferred implementation of a method for controlling a connection.

DESCRIPTION OF THE PREFERRED EMBODIMENTS

FIG. 1 schematically depicts a vehicle 10 with an electric motor. What is meant by "vehicle" is any machine which can move under the action of an engine. Consequently, a vehicle 10 can be a motorcycle, a car, a van, a truck, a bus, etc.

As illustrated by FIG. 1, the vehicle 10 comprises a battery 12 for supplying power to an electric motor (which is not depicted in the figures), and an electrical socket 11 connected to the battery 12 via a device 20 for controlling a connection. The electrical socket 11 makes it possible to connect an electrical connector 91 of a charging station 90, so as to recharge the battery 12. The device 20 for controlling a connection makes it possible to connect the battery 12 to the electrical socket 11, in which case charging the battery 12 using the charging station 90 is possible, or to disconnect said battery 12 from said electrical socket 11, in which case charging the battery 12 is impossible.

FIG. 2 schematically depicts an exemplary embodiment of a device 20 for controlling a connection.

As illustrated by FIG. 2, the device 20 for controlling a connection comprises a first contactor 30 and a second contactor 40. As is known, a contactor is an electrotechnical device making it possible to establish (in a closed state of the contactor) or to interrupt (in an open state of the contactor) the flow of electric current.

The first contactor 30 is arranged between a first terminal 121 of the battery 12 and a first terminal 111 of the electrical socket 11. Similarly, the second contactor 40 is arranged between a second terminal 122 of the battery 12 and a second terminal 112 of the electrical socket 11. Typically, in order to be able to supply power to an electric motor, the order of magnitude of the voltage between the first terminal 121 and the second terminal 122 of the battery 12, when the latter is charged, can be several hundred volts (V). The order of magnitude of the current flowing between the battery 12 and the electrical socket 11, when the first contactor 30 and the second contactor 40 are in a closed state, can be several tens of amperes (A).

In order to be able to be controlled so as to enter the closed state or so as to enter the open state, the first contactor 30 comprises a first control terminal 31 and a second control terminal 32, and the second contactor 40 comprises a first control terminal 41 and a second control terminal 42.

As illustrated by FIG. 2, the device 20 for controlling a connection also comprises, so as to control the first contactor 30 and the second contactor 40, a first computer 50 and a second computer 60 which is distinct from said first computer 50 in hardware terms.

The first computer 50 comprises a high-side switch 51, arranged between a power supply line and the first control terminal 31 of the first contactor 30, and a low-side switch 52 arranged between the second control terminal 42 of the second contactor 40 and a ground line.

Symmetrically, the second computer 60 comprises a low-side switch 62 arranged between the second control terminal 32 of the first contactor 30 and the ground line, and a high-side switch 61 arranged between the power supply line and the first control terminal 41 of the second contactor 40.

The high-side switches 51, 61 and the low-side switches 52, 62 are, for example, MOS transistors.

The voltage between the power supply line and the ground line is much smaller than that between the first terminal 121 and the second terminal 122 of the battery 12. The order of magnitude of the voltage between the power supply line and the ground line is typically from several volts to several tens of volts. The voltage between the power supply line and the ground line is generally delivered by a second battery (which is not depicted in the figures) of the vehicle 10, distinct from the battery 12, and delivering a voltage across these terminals which is much smaller than that of the battery 12. The voltage between the power supply line and the ground line is denoted by Vcmd in the figures.

The first computer 50 comprises a processing circuit 53 configured to control the high-side switch 51 and the low-side switch 52 of said first computer 50. Similarly, the second computer 60 comprises a processing circuit 63 configured to control the high-side switch 61 and the low-side switch 62 of said second computer 60.

Each processing circuit 53, 63 comprises, for example, one or more processors and storage means (magnetic hard disk, electronic memory, optical disk, etc.) on which a computer program product is stored, in the form of a set of program code instructions to be executed so as to control the high-side switch 51, 61 and the low-side switch 52, 62. Alternatively or in addition, each processing circuit 53, 63 comprises one or more programmable logic circuits (FPGA, PLD, etc.), and/or one or more specialized integrated circuits (ASIC), and/or a set of discrete electronic components, etc., so as to control the high-side switch 51, 61 and the low-side switch 52, 62.

In other words, each processing circuit 53, 63 corresponds to a set of means which are configured in terms of software (specific computer program product) and/or hardware (FPGA, PLD, ASIC, etc.) to control the high-side switch 51, 61 and the low-side switch 52, 62.

When the high-side switch 51 of the first computer 50 and the low-side switch 62 of the second computer 60 are both in a closed state, the first contactor 30 is also in the closed state. If the high-side switch 51 of the first computer 50 and/or the low-side switch 62 of the second computer 60 are in an open state, the first contactor 30 is also in the open state.

When the high-side switch 61 of the second computer 60 and the low-side switch 52 of the first computer 50 are both in a closed state, the second contactor 40 is also in the closed state. If the high-side switch 61 of the second computer 60 and/or the low-side switch 52 of the first computer 50 are in an open state, the second contactor 40 is also in the open state.

Thus, the connection and the disconnection of the battery 12 and the electrical socket 11 is controlled by the device 20 for controlling a connection by means of two distinct computers, namely the first computer 50 and the second computer 60. In that case, a device 20 for controlling a connection at an ASIL D safety level can be obtained using two computers each checking a lower safety level, typically an ASIL B safety level. Furthermore, the first computer 50 and the second computer 60 are symmetrical in that they both comprise a high-side switch 51, 61 making it possible to connect the first control terminal 31, 41 of a contactor to the power supply line, and a low-side switch 52, 62 making it possible to connect the second control terminal 42, 32 to the ground line. Consequently, the first computer 50 and the second computer 60, although distinct in hardware terms, can comprise many hardware components and/or many software components which are identical.

FIG. 3 schematically depicts a preferred embodiment of the device 20 for controlling a connection.

As illustrated by FIG. 3, the device 20 for controlling a connection reuses all the elements described with reference to FIG. 2. Furthermore, the first control terminal 31 of the first contactor 30 and the first control terminal 41 of the second contactor 40 are connected to the power supply line by means of respective high-side resistive components 54, 64. The second control terminal 32 of the first contactor 30 and the second control terminal 42 of the second contactor 40 are connected to the ground line by means of respective low-side resistive components 65, 55.

As a result of the presence of the high-side resistive components 54, 64 and of the low-side resistive components 55, 65, it is possible to diagnose the first contactor 30 and the second contactor 40, that is to say that it is possible to determine whether the first contactor 30 and/or the second contactor 40 exhibit an operating problem. If a problem is detected, the device 20 for controlling a connection does not authorize the connection between the battery 12 and the electrical socket 11.

For example, the high-side resistive components 54, 64 and the low-side resistive components 55, 65 are all non-limitingly considered to be equal resistances, much greater than those of the first contactor 30 and of the second contactor 40. In that case, when the high-side switch 51 of the first computer 50 and the low-side switch 62 of the second computer 60 are both in the open state, then the voltage at the first control terminal 31 of the first contactor 30 and the voltage at the second control terminal 32 of the first contactor 30 should both be substantially equal to Vcmd/2. If this is the case, then no problem is detected at the first contactor 30. If at least one of these voltages differs too greatly from Vcmd/2, then that is abnormal behavior and a problem is detected at the first contactor 30. The diagnosis of the second contactor 40 can be made similarly, by measuring the voltage at the first control terminal 41 of the second contactor 40 and/or the voltage at the second control terminal 42 of said second contactor 40. The types of problems which can be detected are not limited to problems internal to the contactors, and can particularly correspond to a short circuit in the power supply line, to a short circuit in the ground line, to an open circuit at a contactor, etc.

It should be noted that such a diagnosis, when it is made, can be made only by the first computer 50 or only by the second computer 60 or, preferably, be made both by the first computer 50 and by the second computer 60.

DESCRIPTION OF THE EMBODIMENTS

In preferred embodiments, the processing circuit 53 of the first computer 50 is configured:

to measure the voltage at the first control terminal 31 of the first contactor 30 and to measure the voltage at the second control terminal 42 of the second contactor 40, and to diagnose the first contactor 30 and the second contactor 40 according to said voltage measurements.

Alternatively or in addition, in preferred embodiments, the processing circuit 63 of the second computer 60 is configured:

to measure the voltage at the second control terminal 32 of the first contactor 30 and to measure the voltage at the first control terminal 41 of the second contactor 40, and to diagnose the first contactor 30 and the second contactor 40 according to said voltage measurements.

With such provisions, the first computer 50 and the second computer 60 can diagnose the first contactor 30 and the second contactor 40 and, according to the result of the diagnosis, decide to control the first contactor 30 and the second contactor 40 so as to enter the closed state or not.

In order to further improve the reliability and the robustness of the device 20 for controlling a connection, said device for controlling a connection can comprise, in preferred embodiments, a communication bus 70 which connects the first computer 50 and the second computer 60. The communication bus 70, for example of CAN (controller area network) type, can be of any type making it possible to exchange data.

Via this communication bus 70, depicted in FIG. 3, the first computer 50 and the second computer 60 can exchange diagnostic information and/or synchronization information. The processing circuit 53 of the first computer 50 and the processing circuit 63 of the second computer 60 are furthermore configured to control each high-side switch 51, 61 and each low-side switch 52, 62 taking into account the diagnostic information and/or the synchronization information received over said communication bus.

The diagnostic information corresponds, for example, to the results of the diagnosis made, and each computer can send the result of the diagnosis made to the other computer. Thus, a computer which has not detected a problem can be informed that the other computer has, in contrast, detected a problem. In that case, it is not necessarily possible to know which of the computers was mistaken in its diagnosis, and it is therefore appropriate not to authorize the connection between the battery 12 and the electrical socket 11. The synchronization information mainly aims to synchronize the various actions performed by the first computer 50 and the second computer 60, in order for them to be able to perform the diagnosis of the first contactor 30 and of the second contactor 40 in a coordinated fashion and, when no problem is detected, place them in the closed state.

FIG. 4 schematically depicts the main steps of a method 80 for controlling a connection. It should be noted that the order of the steps which are depicted in FIG. 4 is not limiting, and that consequently said steps can be performed in a different order.

The method 80 for controlling a connection is implemented by both the first computer 50 and second computer 60. It should, however, be noted that the first computer 50 and the second computer 60 can use different implementations of the method 80 for controlling a connection. However, the implementations used by the first computer 50 and by the second computer 60 are preferably identical.

In the rest of the description, the steps of the method 80 for controlling a connection are described considering the method 80 for controlling a connection being performed by the processing circuit 53 of the first computer 50.

All that is described below is also applicable to the second computer 60, by reversing the roles of said first computer 50 and of said second computer 60.

In the rest of the description, the case where the low-side switch 52, 62 of a contactor 40, 30 must be placed in the closed state before the high-side switch 51, 61 of said contactor 30, 40 is furthermore non-limitingly considered. In that case, the low-side switch 52, 62 serves to activate the contactor 40, 30 under consideration, whereas the high-side switch 51, 61 is, for example, controlled with a pulse-width modulated (PWM) signal in order to control the intensity of the current flowing through the contactor 30, 40. Nothing, however, excludes, following other examples, reversing the roles of the low-side switch 52, 62 and of the high-side switch 51, 61, or indeed not imposing a particular order for the transition to the closed state of the low-side switch 52, 62 of a contactor 40, 30 and of the high-side switch 51, 61 of said contactor 30, 40.

As illustrated by FIG. 4, when it is performed by the first computer 50 and when all the low-side switches 52, 62 and all the high-side switches 51, 61 are in the open state, the method 80 for controlling a connection comprises:

a step E1 of the second contactor 40 being diagnosed by the first computer 50, the low-side switch 52 of the first computer 50 being controlled so as to enter the closed state by the first computer only if no problem is detected at the second contactor 40 by said first computer 50, and a step E2 of the first contactor 30 being diagnosed by the first computer 50, the high-side switch 51 of the first computer 50 being controlled so as to enter the closed state by the first computer 50 only if no problem is detected at the first contactor 30 by said first computer 50.

During the step E1 of diagnosing the second contactor 40, the processing circuit 53 of the first computer 50 measures the voltage at the second control terminal 42 of the second contactor 40, and determines whether said second contactor 40 is liable to exhibit an operating problem, for example such as described previously.

When a problem is detected (reference sign E1*a* in FIG. 4), the first computer 50 does not control the low-side switch 52 so as to enter the closed state. In the non-limiting example illustrated by FIG. 4, the performance of the method 80 for controlling a connection is furthermore interrupted without performing the step E2 of diagnosing the first contactor 30. When no problem is detected (reference sign E1*b* in FIG. 4), the first computer 50 performs the step E2 of diagnosing the first contactor 30.

During the step E2 of diagnosing the first contactor 30, the processing circuit 53 of the first computer 50 measures the voltage at the first control terminal 31 of the first contactor 30, and determines whether said first contactor 30 is liable to exhibit an operating problem, for example such as described previously.

When a problem is detected (reference sign E2*a* in FIG. 4), the first computer 50 does not control the high-side switch 51 so as to enter the closed state. In the example illustrated by FIG. 4, the first computer 50 does not control the low-side switch 52 so as to enter the closed state either. When no problem is detected (reference sign E2*b* in FIG. 4), the first computer 50 can perform a step E3 of controlling the low-side switch 52 so as to enter the closed state and a step E4 of controlling the high-side switch 51 so as to enter the closed state, optionally provided that other conditions are fulfilled.

Particularly, when the first computer 50 and the second computer 60 can exchange diagnostic information over a communication bus 70, then the first computer 50 can receive diagnostic information corresponding to the results of the diagnoses of the first contactor 30 and of the second contactor 40 made by the second computer 60. In that case, the processing circuit 53 of the first computer 50 is preferably configured to:

controlling the high-side switch 51 so as to enter the closed state only if no problem is detected at the first contactor 30 and/or at the second contactor 40 by the second computer 60, and controlling the low-side switch 52 so as to enter the closed state only if no problem is detected at the first contactor 30 and/or at the second contactor 40 by the second computer 60.

FIG. 5 schematically depicts a preferred implementation of the method 80 for controlling a connection of FIG. 4, in which the device 20 for controlling a connection comprises a communication bus 70 used to exchange both diagnostic information and synchronization information. The method 80 for controlling a connection of FIG. 5 starts with the steps E1 and E2 described previously.

As illustrated by FIG. 5, the method 80 for controlling a connection comprises a step E5 of transmitting diagnostic information to the second computer 60. The step E5 of transmitting diagnostic information is performed both when no problem is detected by the first computer 50 and when a problem is detected by the first computer 50. The diagnostic information transmitted by the first computer 50 aims to inform the second computer 60 of the results of the diagnoses of the first contactor 30 and of the second contactor 40 made by said first computer 50.

The method 80 for controlling a connection also comprises a step E6 of receiving diagnostic information transmitted by the second computer 60, and a step E7 of determining whether the second computer 60 has detected a problem at the first contactor 30 and/or at the second contactor 40 according to the diagnostic information received from said second computer 60. When a problem has been detected by the second computer 60 (reference sign E7*a* in FIG. 5), the first computer 50 does not control the high-side switch 51 so as to enter the closed state and does not control the low-side switch 52 so as to enter the closed state. When no problem has been detected by the second computer 60 (reference sign E7*b* in FIG. 5), the performance of the method 80 for controlling a connection continues and the first computer 50 controls the low-side switch 52 so as to enter the closed state (step E3).

Next, the method 80 for controlling a connection comprises a step E8 of the first computer 50 transmitting synchronization information indicating to the second computer 60 that the low-side switch 52 of the second contactor 40 has been controlled so as to enter the closed state.

Similarly, the second computer 60 is meant to transmit synchronization information indicating that it has controlled the low-side switch 62 of the first contactor 30 so as to enter the closed state, and the method 80 for controlling a connection comprises, on the part of the first computer 50, a step E9 of receiving the synchronization information transmitted by said second computer 60.

The method 80 for controlling a connection comprises next a step E10 of determining whether the second computer 60 has controlled the low-side switch 62 of the first contactor 30 so as to enter the closed state, according to the synchronization information received from said second computer 60. When the second computer 60 has not controlled the low-side switch 62 of the first contactor 30 so as to enter the closed state (reference sign E10*a* in FIG. 5), the first computer 50 does not control the high-side switch 51 so as to enter the closed state. The performance of the method 80 for controlling a connection is interrupted and the low-side switch 52 of the second contactor 40 is, for example, controlled so as to enter the open state.

When the second computer 60 has controlled the low-side switch 62 of the first contactor 30 so as to enter the closed state (reference sign E10*b* in FIG. 5), the performance of the method 80 for controlling a connection continues.

In the example illustrated by FIG. 5, the method 80 for controlling a connection further comprises an optional step E11 of the first contactor 30 being diagnosed by said first computer. During the step E11 of diagnosing the first contactor 30, the first computer 50 checks that the low-side switch 62 of the first contactor 30 has indeed been moved into the closed state by the second computer 60. For example, the processing circuit 53 of the first computer 50 measures the voltage at the first control terminal 31 of the first contactor 30 and checks whether the measured voltage corresponds to a predefined voltage which is expected when the low-side switch 62 is in the closed state (and the high-side switch 51 is in the open state). When a problem is detected at the first contactor 30 (reference sign E11*a* in FIG. 5), the first computer 50 does not control the high-side switch 51 so as to enter the closed state. The performance of the method 80 for controlling a connection is interrupted and the low-side switch 52 of the second contactor 40 is, for example, controlled so as to enter the open state.

When no problem is detected at the first contactor 30 (reference sign E11*b* in FIG. 5), the performance of the method 80 for controlling a connection continues, and the first computer 50 controls the high-side switch 51 of the first contactor 30 so as to enter the closed state (step E4).

Other variants of the method 80 for controlling a connection are also conceivable. Particularly, it is also possible, after the first computer 50 has controlled the high-side switch 51 of the first contactor 30 so as to enter the closed state, to check whether the second computer 60 has also controlled the high-side switch 61 of the second contactor 40 so as to enter the closed state, for example by exchanging synchronization information over the communication bus 70. If no synchronization information confirming that the high-side switch 61 of the second contactor 40 has been controlled so as to enter the closed state, the first computer 50 can, for example, control both the low-side switch 52 of the second contactor 40 and the high-side switch 51 of the first contactor 30 so as to enter the open state.

The invention claimed is:

1. A device for controlling a connection, in a vehicle with an electric motor, between an electrical socket of said vehicle and a battery of said vehicle, said electrical socket being intended to interact with an electrical connector so as to charge said battery, and said battery being intended to supply power to the electric motor of said vehicle, wherein:
   the device for controlling a connection comprises a first contactor arranged between a first terminal of the battery and a first terminal of the electrical socket, a second contactor arranged between a second terminal of the battery and a second terminal of the electrical socket, a first computer and a second computer,
   the first contactor comprises a first control terminal and a second control terminal, and the second contactor comprises a first control terminal and a second control terminal,
   the first computer comprises a high-side switch, arranged between a power supply line and the first control terminal of the first contactor, and a low-side switch arranged between the second control terminal of the second contactor and a ground line, and
   the second computer comprises a low-side switch arranged between the second control terminal of the first contactor and the ground line, and a high-side switch arranged between the power supply line and the first control terminal of the second contactor.

2. The device for controlling a connection as claimed in claim 1, wherein the first computer and the second computer are identical.

3. The device for controlling a connection as claimed in claim 1, wherein the first control terminal of the first contactor and the first control terminal of the second contactor are connected to the power supply line by means of respective high-side resistive components, and the second control terminal of the first contactor and the second control terminal of the second contactor are connected to the ground line by means of respective low-side resistive components.

4. The device for controlling a connection as claimed in claim 3, wherein the first computer comprises a processing circuit configured:
   to measure a voltage at the first control terminal of the first contactor and to measure a voltage at the second control terminal of the second contactor, and
   to diagnose the first contactor and the second contactor according to the voltage measurements.

5. The device for controlling a connection as claimed in claim 3, wherein the second computer comprises a processing circuit configured:
   to measure a voltage at the second control terminal of the first contactor and to measure a voltage at the first control terminal of the second contactor, and
   to diagnose the first contactor and the second contactor according to the voltage measurements.

6. The device for controlling a connection as claimed in claim 1, wherein the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

7. A vehicle comprising an electric motor, a battery intended to supply power to said electric motor and an electrical socket intended to interact with an electrical connector so as to charge said battery, further comprising a device for controlling a connection as claimed in claim 1, arranged between said electrical socket and said battery of the motor vehicle.

8. A method for controlling a connection implemented by a device for controlling a connection as claimed in claim 1, the method comprising, when each high-side switch and each low-side switch is in the open state, steps of:
   the first contactor being diagnosed by the first computer, the high-side switch of the first computer being controlled so as to enter the closed state by the first computer only if no problem is detected at the first contactor by said first computer, and
   the second contactor being diagnosed by the first computer, the low-side switch of the first computer being controlled so as to enter the closed state by the first computer only if no problem is detected at the second contactor by said first computer.

9. The method for controlling a connection as claimed in claim 8, wherein:
   the high-side switch of the first computer is controlled so as to be in the closed state by the first computer only if no problem is detected on the first contactor and/or on the second contactor by the second computer, and
   the low-side switch of the first computer is controlled so as to enter the closed state by the first computer only if no problem is detected at the first contactor and/or at the second contactor by the second computer.

10. The method for controlling a connection as claimed in claim 8, comprising, after the first computer has controlled the low-side switch so as to enter the closed state and before controlling the high-side switch so as to enter the closed state, a step of the first contactor being diagnosed by said first computer, the high-side switch of the first computer being controlled so as to enter the closed state by the first computer only if no problem is detected at the first contactor by said first computer.

11. The method for controlling a connection as claimed in claim 8, wherein the high-side switch of the first computer is controlled so as to enter the closed state by the first computer only if said first computer has received, from the second computer, synchronization information indicating that the low-side switch of said second computer has been controlled so as to enter the closed state.

12. The device for controlling a connection as claimed in claim 2, wherein the first control terminal of the first contactor and the first control terminal of the second contactor are connected to the power supply line by means of respective high-side resistive components, and the second control terminal of the first contactor and the second control terminal of the second contactor are connected to the ground line by means of respective low-side resistive components.

13. The device for controlling a connection as claimed in claim 4, wherein the second computer comprises a processing circuit configured:
to measure a voltage at the second control terminal of the first contactor and to measure a voltage at the first control terminal of the second contactor, and
to diagnose the first contactor and the second contactor according to the voltage measurements.

14. The device for controlling a connection as claimed in claim 2, wherein the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

15. The device for controlling a connection as claimed in claim 3, wherein the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

16. The device for controlling a connection as claimed in claim 4, wherein the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

17. The device for controlling a connection as claimed in claim 5, wherein the first computer and the second computer are connected by means of a communication bus so as to exchange diagnostic information and/or synchronization information, said first computer and said second computer being configured to control each high-side switch and each low-side switch taking into account the diagnostic information and/or the synchronization information received over said communication bus.

18. A vehicle comprising an electric motor, a battery intended to supply power to said electric motor and an electrical socket intended to interact with an electrical connector so as to charge said battery, further comprising a device for controlling a connection as claimed in claim 2, arranged between said electrical socket and said battery of the motor vehicle.

19. A vehicle comprising an electric motor, a battery intended to supply power to said electric motor and an electrical socket intended to interact with an electrical connector so as to charge said battery, further comprising a device for controlling a connection as claimed in claim 3, arranged between said electrical socket and said battery of the motor vehicle.

20. A vehicle comprising an electric motor, a battery intended to supply power to said electric motor and an electrical socket intended to interact with an electrical connector so as to charge said battery, further comprising a device for controlling a connection as claimed in claim 4, arranged between said electrical socket and said battery of the motor vehicle.

* * * * *